(12) United States Patent
Yuan et al.

(10) Patent No.: US 12,473,635 B2
(45) Date of Patent: Nov. 18, 2025

(54) DIELECTRIC ARTICLE

(71) Applicant: SILCOTEK CORP., Bellefonte, PA (US)

(72) Inventors: Min Yuan, State College, PA (US); Jesse Bischof, Bellefonte, PA (US)

(73) Assignee: Silcotek Corp., Bellefonte, PA (US)

( * ) Notice: Subject to any disclaimer, the term of this patent is extended or adjusted under 35 U.S.C. 154(b) by 1037 days.

(21) Appl. No.: 17/328,317

(22) Filed: May 24, 2021

(65) Prior Publication Data

US 2021/0384601 A1 Dec. 9, 2021

Related U.S. Application Data

(60) Provisional application No. 63/034,126, filed on Jun. 3, 2020.

(51) Int. Cl.
*C23C 16/30* (2006.01)
*C23C 16/24* (2006.01)
*H01P 3/08* (2006.01)

(52) U.S. Cl.
CPC .............. *C23C 16/30* (2013.01); *C23C 16/24* (2013.01); *H01P 3/08* (2013.01); *Y10T 428/265* (2015.01)

(58) Field of Classification Search
CPC ....... C23C 16/30; C23C 16/24; C23C 16/345; C23C 16/401; C23C 16/402; Y10T 428/265; H01P 3/08
See application file for complete search history.

(56) References Cited

U.S. PATENT DOCUMENTS

| | | |
|---|---|---|
| 4,173,661 A | 11/1979 | Bourdon |
| 4,402,997 A | 9/1983 | Hogan et al. |
| 4,560,589 A | 12/1985 | Endou et al. |
| 4,579,752 A | 4/1986 | Dubois et al. |
| 4,671,997 A | 6/1987 | Galasso et al. |
| 4,684,542 A | 8/1987 | Jasinski et al. |
| 4,714,632 A | 12/1987 | Cabrera et al. |
| 4,720,395 A | 1/1988 | Foster |
| 4,741,964 A | 5/1988 | Haller |
| 4,749,631 A | 6/1988 | Haluska et al. |
| 4,753,856 A | 6/1988 | Haluska et al. |
| 4,792,460 A | 12/1988 | Chu et al. |
| 4,842,888 A | 6/1989 | Haluska et al. |
| 4,956,204 A | 9/1990 | Amazawa et al. |
| 5,128,515 A | 7/1992 | Tanaka |
| 5,141,567 A | 8/1992 | Tahara |
| 5,160,544 A | 11/1992 | Garg et al. |
| 5,208,069 A | 5/1993 | Clark et al. |

(Continued)

FOREIGN PATENT DOCUMENTS

| | | |
|---|---|---|
| CN | 100347834 | 11/2007 |
| CN | 104294236 A | 1/2015 |

(Continued)

*Primary Examiner* — Alicia J Weydemeyer
*Assistant Examiner* — Laura B Figg
(74) *Attorney, Agent, or Firm* — Saxton & Stump, LLC

(57) ABSTRACT

Dielectric coatings, articles having dielectric coatings, and systems including coating having dielectric coatings are disclosed. The dielectric article includes a substrate having hidden surfaces and a dielectric coating on the hidden surfaces of the substrate. The dielectric coating has a bulk resistivity of at least $10^8$ Ω·cm and a thickness of between 30 nanometers and 3,000 nanometers.

19 Claims, 2 Drawing Sheets

(56) References Cited

U.S. PATENT DOCUMENTS

| | | |
|---|---|---|
| 5,249,554 A | 10/1993 | Tamor et al. |
| 5,250,451 A | 10/1993 | Chouan |
| 5,270,082 A | 12/1993 | Lin et al. |
| 5,299,731 A | 4/1994 | Liyanage et al. |
| 5,413,813 A | 5/1995 | Cruse et al. |
| 5,474,613 A | 12/1995 | Pickering et al. |
| 5,480,677 A | 1/1996 | Li et al. |
| 5,481,135 A | 1/1996 | Chandra et al. |
| 5,510,146 A | 4/1996 | Miyasaki |
| 5,562,952 A | 10/1996 | Nakahigashi et al. |
| 5,563,102 A | 10/1996 | Michael |
| 5,756,404 A | 5/1998 | Friedenreich et al. |
| 5,818,071 A | 10/1998 | Loboda et al. |
| 5,825,078 A | 10/1998 | Michael |
| 5,874,368 A | 2/1999 | Laxman et al. |
| 5,939,333 A | 8/1999 | Hurley et al. |
| 5,981,403 A | 11/1999 | Ma et al. |
| 5,994,675 A | 11/1999 | Bethune et al. |
| 5,997,742 A | 12/1999 | Gjerde et al. |
| 6,157,003 A | 12/2000 | Drimer |
| 6,159,871 A | 12/2000 | Loboda et al. |
| 6,312,808 B1 | 11/2001 | Veerasamy et al. |
| 6,319,556 B1 | 11/2001 | Olsen et al. |
| 6,337,459 B1 | 1/2002 | Terwijn et al. |
| 6,416,577 B1 | 7/2002 | Suntoloa et al. |
| 6,416,816 B2 | 7/2002 | Veerasamy et al. |
| 6,444,268 B2 | 9/2002 | Lefcowitz et al. |
| 6,444,326 B1 | 9/2002 | Smith |
| 6,472,076 B1 | 10/2002 | Hacker |
| 6,511,760 B1 | 1/2003 | Barone et al. |
| 6,531,182 B2 | 3/2003 | Veerasamy et al. |
| 6,531,398 B1 | 3/2003 | Gaillard et al. |
| 6,531,415 B1 | 3/2003 | Yang et al. |
| 6,566,281 B1 | 5/2003 | Buchanan et al. |
| 6,592,993 B2 | 7/2003 | Veerasamy et al. |
| 6,593,655 B1 | 7/2003 | Loboda et al. |
| 6,630,413 B2 | 10/2003 | Todd |
| 6,765,178 B2 | 7/2004 | Shang et al. |
| 6,998,579 B2 | 2/2006 | Inagawa et al. |
| 7,022,948 B2 | 4/2006 | Shang et al. |
| 7,070,833 B2 | 7/2006 | Smith et al. |
| 7,192,626 B2 | 3/2007 | Dussarrat et al. |
| 7,429,717 B2 | 9/2008 | Yudovsky |
| 7,510,935 B2 | 3/2009 | Lee et al. |
| 7,860,379 B2 | 12/2010 | Hunter et al. |
| 7,867,627 B2 | 1/2011 | Smith et al. |
| 7,875,556 B2 | 1/2011 | Xiao et al. |
| 8,092,770 B2 | 1/2012 | Betz et al. |
| 8,286,571 B2 | 10/2012 | Driver et al. |
| 8,357,430 B2 | 1/2013 | Dussarrat et al. |
| D689,107 S | 9/2013 | Grove |
| 8,552,346 B2 | 10/2013 | Ambal et al. |
| 8,563,445 B2 | 10/2013 | Liang et al. |
| D713,024 S | 9/2014 | Grove et al. |
| 8,822,018 B2 | 9/2014 | Thoumazet et al. |
| 8,980,382 B2 | 3/2015 | Ingle et al. |
| 9,198,283 B2 * | 11/2015 | Ellinger ............... H05K 1/0284 |
| 9,340,880 B2 | 5/2016 | Mattzela |
| 9,777,368 B2 | 10/2017 | Smith et al. |
| 9,915,001 B2 | 3/2018 | Yuan et al. |
| 9,975,143 B2 | 5/2018 | Smith et al. |
| 10,087,521 B2 * | 10/2018 | Yuan ............... C23C 16/45523 |
| 10,316,408 B2 | 6/2019 | Smith et al. |
| 10,323,321 B1 | 6/2019 | Yuan et al. |
| 10,487,402 B2 | 11/2019 | Yuan et al. |
| 10,487,403 B2 | 11/2019 | Smith |
| 10,604,660 B2 | 3/2020 | Smith et al. |
| 2001/0049203 A1 | 12/2001 | Kim et al. |
| 2001/0055672 A1 | 12/2001 | Todd |
| 2002/0045009 A1 | 4/2002 | Tobaski et al. |
| 2003/0141499 A1 * | 7/2003 | Venkatraman .... H01L 21/02301 556/400 |
| 2003/0152701 A1 | 8/2003 | Kang et al. |
| 2003/0186000 A1 | 10/2003 | Li et al. |
| 2004/0037956 A1 | 2/2004 | Yang |
| 2004/0175579 A1 | 9/2004 | Smith et al. |
| 2005/0064684 A1 | 3/2005 | Todd et al. |
| 2005/0100670 A1 | 5/2005 | Dussarrat et al. |
| 2005/0183663 A1 | 8/2005 | Cheng et al. |
| 2005/0271893 A1 | 12/2005 | Kobrin et al. |
| 2006/0216952 A1 | 9/2006 | Bhanap et al. |
| 2007/0042118 A1 | 2/2007 | Yoo |
| 2007/0243317 A1 | 10/2007 | DuBois et al. |
| 2007/0281448 A1 | 12/2007 | Chen et al. |
| 2009/0078202 A1 | 3/2009 | Strikovski et al. |
| 2009/0230558 A1 | 9/2009 | Matsuoka |
| 2010/0248496 A1 | 9/2010 | Wei et al. |
| 2011/0215445 A1 * | 9/2011 | Yang ................. H01L 21/02164 524/588 |
| 2011/0259879 A1 | 10/2011 | Hanawa et al. |
| 2011/0305784 A1 | 12/2011 | Lee |
| 2012/0045954 A1 | 2/2012 | Bleecher et al. |
| 2012/0219727 A1 | 8/2012 | Gandhiraman et al. |
| 2012/0251797 A1 | 10/2012 | Smith et al. |
| 2013/0244025 A1 | 9/2013 | Smith et al. |
| 2014/0256156 A1 | 9/2014 | Harada et al. |
| 2014/0370300 A1 | 12/2014 | Smith |
| 2015/0024152 A1 | 1/2015 | Carr et al. |
| 2015/0030885 A1 | 1/2015 | Smith |
| 2015/0206795 A1 | 7/2015 | Hasebe et al. |
| 2015/0283307 A1 | 10/2015 | Smith et al. |
| 2015/0371991 A1 | 12/2015 | Nobuto |
| 2016/0049309 A1 | 2/2016 | Tapily et al. |
| 2016/0354758 A1 | 12/2016 | Gorecki et al. |
| 2018/0258529 A1 * | 9/2018 | Vezza ............... C23C 16/45523 |
| 2018/0318742 A1 | 11/2018 | Bevis |
| 2019/0003044 A1 | 1/2019 | Yuan |
| 2019/0086371 A1 | 3/2019 | Lauber et al. |

FOREIGN PATENT DOCUMENTS

| | | |
|---|---|---|
| DE | 2523257 | 12/1976 |
| DE | 2829568 | 1/1980 |
| EP | 0911307 A1 | 4/1999 |
| EP | 1150345 A2 | 4/2001 |
| EP | 0996767 B1 | 9/2003 |
| EP | 1790757 A1 | 5/2007 |
| EP | 1988190 A2 | 11/2008 |
| GB | 2395492 A | 5/2004 |
| JP | 2012138627 A | 7/2012 |
| JP | 2013227628 A | 11/2013 |
| WO | 9902757 A1 | 1/1999 |
| WO | 0136190 A1 | 5/2001 |
| WO | 2009032488 A1 | 3/2009 |
| WO | 2009143618 A1 | 12/2009 |
| WO | 2010125926 A1 | 4/2010 |
| WO | 2010079299 A1 | 7/2010 |
| WO | 2011056550 A1 | 5/2011 |
| WO | 2012047945 A2 | 4/2012 |

* cited by examiner

DIELECTRIC ARTICLE

PRIORITY

The present application is a Non-Provisional Patent Application which claims priority and benefit of U.S. Provisional Patent Application No. 63/034,126, filed Jun. 3, 2020, and titled "DIELECTRIC ARTICLE," the entirety of which is incorporated by reference.

FIELD OF THE INVENTION

The present invention is directed to dielectrics. More particularly, the present invention is directed to dielectric coatings, articles having dielectric coatings, and systems including articles having dielectric coatings.

BACKGROUND OF THE INVENTION

Specific precursors in atomic layer deposition (ALD) are known to produce dielectric materials, also referred to as electrical insulators. Such dielectric materials are useful in conventional insulators for electrical and microelectronic encapsulation as well as with active device architectures, such as, rectifiers, semiconductors, transducers, capacitors, and transformers. Materials used in conjunction with ALD to produce dielectric materials include polydimethylsiloxane (triethylsiloxyl terminated), hafnium n-butoxide, hafnium dimethylamide, zirconium 2-methyl-2butoxide, niobium (V) ethoxide, barium titanium, hexachlorodislane, tetraiodosilane, and chroloethylsilsesquioxane solution in methoxypropanol. No known materials produced have achieved all properties desired.

Thermal chemical vapor deposition (CVD) contrasts ALD by being compositionally and conformally less precise. For example, a coating deposited by CVD is not grown one atomic layer at a time like is done by ALD, so there is some variation. In addition, the uniformity of the conformality of CVD differs because one area of a coating from CVD may have slightly higher or lower thickness compared to another. This contrasts to ALD producing a generally precise single thickness on all coated surfaces. Static or batch CVD (in contrast to CVD occurring while gases flow through a chamber) has even more variability. These different growth mechanisms result in substantially different processing considerations.

Dielectric products are well known. However, the importance of consistency of composition and thickness of coatings for dielectrics has resulted in use of ALD to produce them in contrast to CVD, especially static or batch CVD.

Dielectric articles able to be reliably produced by CVD would be desirable in the art.

BRIEF DESCRIPTION OF THE INVENTION

In an embodiment, a dielectric article includes a substrate having hidden surfaces and a dielectric coating on the hidden surfaces of the substrate. The dielectric coating has a bulk resistivity of at least $10^8$ Ω·cm and a thickness of between 30 nanometers and 3,000 nanometers.

In another embodiment, a dielectric article includes a stainless steel substrate having hidden surfaces and visible surfaces and a silicon-containing dielectric coating on the hidden surfaces and the visible surfaces of the stainless steel substrate. The silicon-containing dielectric coating have a bulk resistivity of at least $10^{12}$ Ω·cm and a thickness of between 100 nanometers and 1,500 nanometers.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are dielectric coatings, articles having dielectric coatings, and systems including coating having dielectric coatings. Embodiments of the present disclosure, for example, in comparison to concepts failing to include one or more of the features disclosed herein, increase inertness (for example, by reduction or elimination of atomic or molecular adsorption and/or by reduction or elimination of metal ion migration), increase resistance to sulfur adsorption, homogenize aesthetics, modify microstructure, reduce or eliminate delamination (or increase adhesion), reduce or eliminate growth of nanowires, modify optical properties, modify porosity, modify corrosion resistance, modify gloss, modify surface features, permit more efficient production of treatments, permit treatment of a wide range of geometries (for example, narrow channels/tubes, three-dimensionally complex geometries, tortuous paths, and/or hidden or non-line-of-site geometries, such as, in needles, tubes, probes, fixtures, complex planar and/or non-planar geometry articles, simple non-planar and/or planar geometry articles, and combinations thereof), permit treatment of a bulk of articles, are capable or being used in or replacing components that are used in industries traditionally believed to be too sensitive for processes that are not flow-through processes (for example, based upon compositional purity, presence of contaminants, thickness uniformity, and/or amount of gas phase nucleation embedded within), allow materials to be used as a substrate that would otherwise produce an electrical arc in a plasma environment (for example, as in plasma-enhanced CVD, which differs considerably from thermal CVD and static/batch process CVD), or permit a combination thereof.

As used herein, the term "thermal CVD" is heat-activated deposition through the breakdown of molecules with fragments assembling within a chamber. Thermal CVD is distinguishable from plasma-enhanced CVD, atomic layer deposition, catalytic processes, UV or radiation activated/initiated processes, and other processes relying upon energy other than heat. In general, the heat relied upon for the thermal CVD is within the range of 300 to 600 degrees Celsius, with sub-ranges generally being between 300 and 500 degrees Celsius, 400 and 600 degrees Celsius, between 350 and 450 degrees Celsius. Certain embodiments are capable of being produced at higher temperatures. As used herein, the terms "static CVD" or "batch CVD" refer to CVD having a precursor introduced for at least a period of time, while the precursor does not flow.

Figure 1:
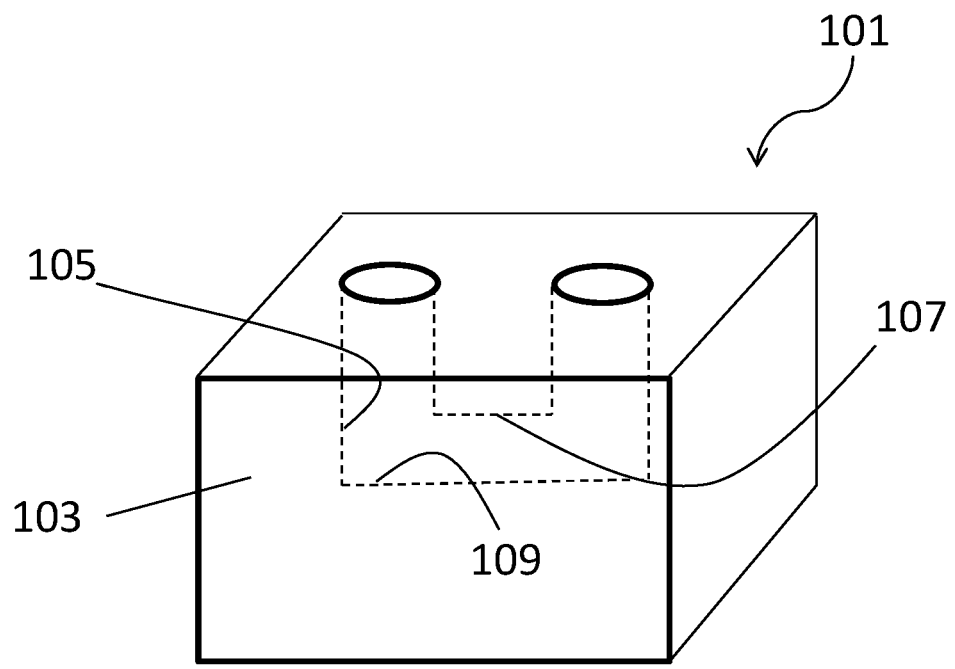
FIG. 1 is a perspective view of a dielectric article, according to an embodiment of the disclosure.

Referring to FIG. 1, a dielectric article 101 includes a substrate 103 and a dielectric coating 105. The dielectric coating 105 is on a hidden surface 107 and/or a visible surface 109 of the substrate 103. As used here, the term "visible" refers to capable of being coated by line-of-sight techniques. As used herein, the term "hidden" refers to not capable of being coated by line-of-sight techniques. The presence of the dielectric coating 105 on the hidden surface 107 permits the dielectric article 101 to include complex and three-dimensional features. Such features include channels, tortuous paths, needles, coiled tubes, non-linear piping, probes, fixtures, folds, filters, springs, injectors, frits, manifolds, or a combination thereof.

The dielectric coating 105 has a thickness corresponding with the substrate 103 and permitting the properties for a desired application. Exemplary thicknesses include being between 50 nanometers and 2,000 nanometers, between 100 nanometers and 1,500 nanometers, between 100 nanometers and 1,000 nanometers, between 100 nanometers and 500 nanometers, between 100 nanometers and 300 nanometers, between 100 nanometers and 200 nanometers, between 300 nanometers and 1,500 nanometers, between 400 nanometers and 1,500 nanometers, between 500 nanometers and 1,500 nanometers, being at least 50 nanometers, being less than 2,000 nanometers, being 100 nanometers, being 300 nanometers, being 1,000 nanometers, or any suitable combination, sub-combination, range, or sub-range thereof.

The composition of the dielectric coating 105 correlates to materials used to form the dielectric coating 105. In one embodiment, static (in contrast to flow-through) thermal chemical vapor deposition is performed with one or more precursors. Suitable precursors include, but are not limited to, silane, silane and ethylene, silane and an oxidizer, dimethylsilane, dimethylsilane and an oxidizer, trimethylsilane, trimethylsilane and an oxidizer, dialkylsilyl dihydride, alkylsilyl trihydride, non-pyrophoric species (for example, dialkylsilyl dihydride and/or alkylsilyl trihydride), thermally-reacted material (for example, carbosilane and/or carboxysilane, such as, amorphous carbosilane and/or amorphous carboxysilane), species capable of a recombination of carbosilyl (disilyl or trisilyl fragments), methyltrimethoxysilane, methyltriethoxysilane, dimethyldimethoxysilane, dimethyldiethoxysilane, trimethylmethoxysilane, trimethylethoxysilane, ammonia, hydrazine, trisilylamine, Bis(tertiary-butylamino)silane, 1,2-bis(dimethylamino)tetramethyldisilane, dichlorosilane, hexachlorodisilane), organofluorotrialkoxysilane, organofluorosilylhydride, organofluoro silyl, fluorinated alkoxysilane, fluoroalkylsilane, fluorosilane, tridecafluoro 1,1,2,2-tetrahydrooctylsilane, (tridecafluoro-1,1,2,2-tetrahydrooctyl) triethoxysilane, triethoxy (3,3,4,4,5,5,6,6,7,7,8,8,8-tridecafluoro-1-octyl) silane, (perfluorohexylethyl) triethoxysilane, silane (3,3,4,4, 5,5,6,6,7,7,8,8,9,9,10,10,10-heptadecafluorodecyl) trimethoxy-, or a combination thereof.

In one embodiment, the dielectric coating 105 includes multiple layers of amorphous silicon and hydrogen, for example, as is disclosed by U.S. Patent Application Publication 2018/0258529, filed on Feb. 27, 2018, entitled "Thermal Chemical Vapor Deposition Coating," the entirety of which is incorporated by reference. In a further embodiment, the dielectric coating 105 includes an atomic concentration of greater than 90% silicon and less than 10% hydrogen, with trace elements being excluded from the atomic concentration. Other suitable atomic concentrations include the silicon being at a concentration of between 90% and 95%, between 90% and 98%, between 90% and 93%, between 93% and 98%, between 93% and 95%, or any suitable combination, sub-combination, range, or sub-range therein. Additionally or alternatively, other suitable atomic concentrations include the hydrogen being at a concentration of between 2% and 10%, between 2% and 8%, between 5% and 8%, between 2% and 5%, between 3% and 5%, or any suitable combination, sub-combination, range, or sub-range therein.

In one embodiment, the dielectric coating 105 includes silicon, nitrogen, and hydrogen, for example, as is disclosed by U.S. Pat. No. 10,087,521, filed Dec. 1, 2015, entitled "Silicon-Nitride-Containing Thermal Chemical Vapor Deposition Coating," the entirety of which is incorporated by reference. In a further embodiment, the dielectric coating 105 includes an atomic concentration of between 30% and 55% silicon and between 45% and 70% nitrogen, with hydrogen and trace elements being excluded from the atomic concentration analysis. Other suitable atomic concentrations include the silicon being at a concentration of between 40% and 55%, between 50% and 55%, between 30% and 40%, between 35% and 40%, between 40% and 50%, or any suitable combination, sub-combination, range, or sub-range therein. Additionally or alternatively, other suitable atomic concentrations include the nitrogen being at a concentration of between 50% and 70%, between 60% and 70%, between 45% and 60%, between 50% and 60%, between 55% and 65%, or any suitable combination, sub-combination, range, or sub-range therein.

In one embodiment, the dielectric coating 105 includes silicon, oxygen, carbon, and hydrogen, for example, as is disclosed by U.S. Pat. No. 10,604,660, filed May 23, 2013, entitled "Wear Resistant Coating, Article, and Method," the entirety of which is incorporated by reference.

Si—15.3%, O—31%, C—10%, H—43.7%

In a further embodiment, the dielectric coating 105 includes an atomic concentration of between 10% and 20% silicon, between 25% and 35% oxygen, between 5% and 15% carbon, and between 40% and 50% hydrogen. Other suitable atomic concentrations include the silicon being at a concentration of between 10% and 15%, between 15% and 20%, between 12% and 17%, between 15% and 16%, or any suitable combination, sub-combination, range, or sub-range therein. Additionally or alternatively, other suitable atomic concentrations include the oxygen being at a concentration of between 25% and 30%, between 30% and 35%, between 30% and 33%, between 30% and 32%, or any suitable combination, sub-combination, range, or sub-range therein. Additionally or alternatively, other suitable atomic concentrations include the carbon being at a concentration of between 5% and 15%, between 5% and 10%, between 10% and 15%, between 7% and 12%, or any suitable combination, sub-combination, range, or sub-range therein. Additionally or alternatively, other suitable atomic concentrations include the hydrogen being at a concentration of between 40% and 45%, between 45% and 50%, between 42% and 44%, between 43% and 44%, or any suitable combination, sub-combination, range, or sub-range therein.

The properties of the dielectric article 101 correspond with the desired application and the dielectric coating 103. Exemplary bulk resistivities include being between $10^8$ $\Omega \cdot cm$ and $10^{14}$ $\Omega \cdot cm$, being between $10^{11}$ $\Omega \cdot cm$ and $10^{14}$ $\Omega \cdot cm$, being between $10^{11}$ $\Omega \cdot cm$ and $10^{13}$ $\Omega \cdot cm$, being between $10^{13}$ $\Omega \cdot cm$ and $10^{15}$ $\Omega \cdot cm$, being at least $10^8$ $\Omega \cdot cm$, being at least $10^{12}$ $\Omega \cdot cm$, being at least $10^{13}$ $\Omega \cdot cm$, or any suitable combination, sub-combination, range, or sub-range thereof.

In one embodiment, properties for the dielectric coating 105 include being inert, for example, by reducing or eliminating penetration of sulfur, hydrogen sulfide, mercury, and/or ammonia (in comparison to bare stainless steel). Additionally or alternatively, in one embodiment, properties for the dielectric coating 105 include reducing or eliminating atomic or molecular adsorption, metal ion migration, or providing a similar barrier. Additionally or alternatively, in another embodiment, properties for the dielectric coating 105 include being corrosion resistant. The corrosion resistance is capable of being illustrated, for example, at room temperature (for example, between 20 and 22 degrees Celsius), by 6M hydrochloric acid for 24 hours resulting in 1 mil per year on stainless steel in contrast to 160 mils per year without the dielectric coating 105, 25% (by volume) sulfuric acid for 24 hours resulting in 5 mil per year on stainless steel in contrast to 55 mils per year without the dielectric coating 105, and/or 12% (by volume) NaOCl for 72 hours resulting in 0.1 mil per year on stainless steel in contrast to 1.7 mils per year without the dielectric coating 105.

Figure 2:
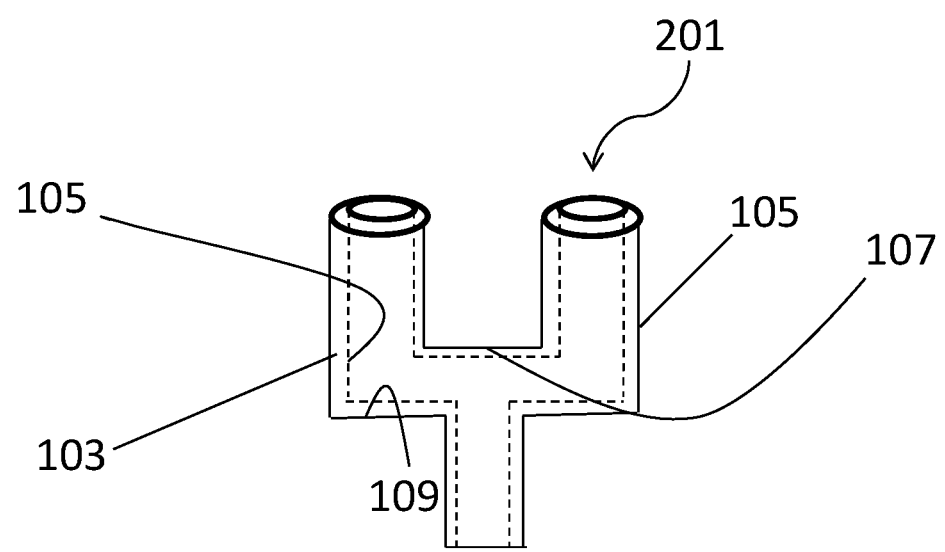
FIG. 2 is a perspective view of an antenna as an embodiment the dielectric article.

The dielectric article 101 is a system, a portion of a system, a component, or any other suitable item capable of receiving the dielectric coating 105. In one embodiment, the dielectric article 101 is, includes, or is a portion of an antenna 201 (see FIG. 2).

Figure 3:
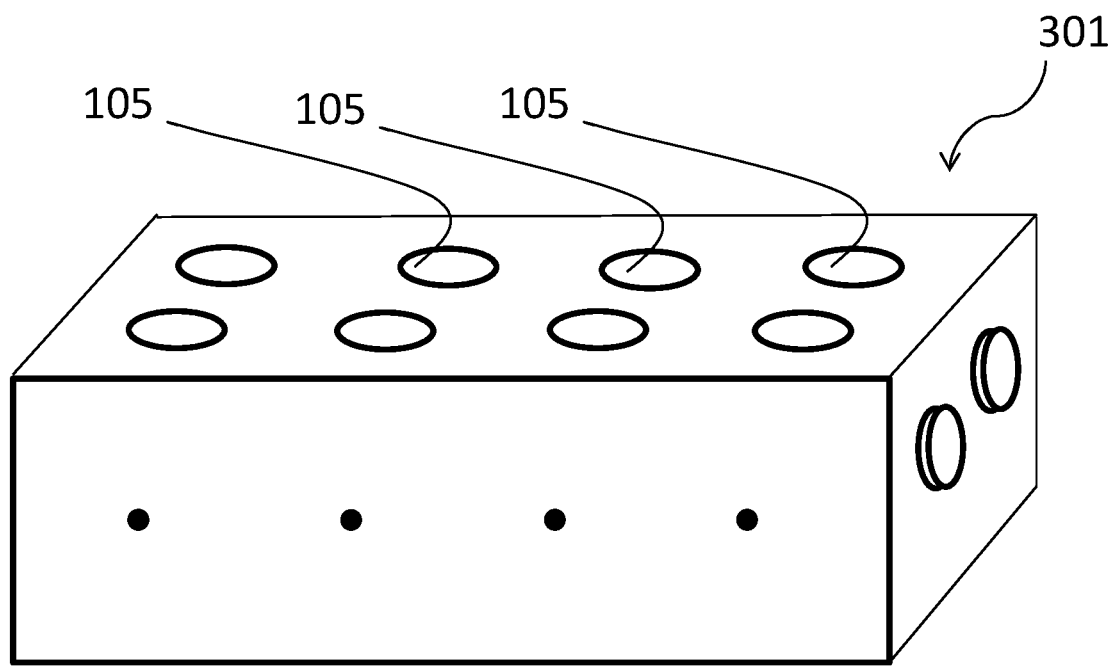
FIG. 3 is a perspective view of a radio frequency system as an embodiment the dielectric article.

In one embodiment, the dielectric article 101 is, includes, or is a portion of a radio frequency (rf) system 301 (see FIG. 3).

Figure 4:
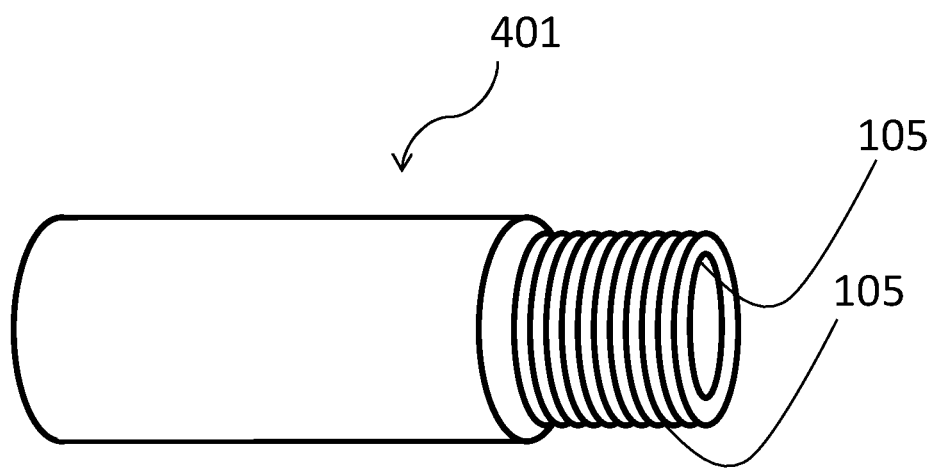
FIG. 4 is a perspective view of a transmission line as an embodiment the dielectric article.

In one embodiment, the dielectric article 101 is, includes, or is a portion of a transmission line 401 (see FIG. 4).

The substrate 103 has a roughness corresponding with the material selected and the end-use of the dielectric article 101. Suitable roughnesses include an average Ra surface roughness value of between 0.2 micrometers and 0.7 micrometers, between 0.3 micrometers and 0.7 micrometers, between 0.2 micrometers and 0.6 micrometers, between 0.2 micrometers and 0.5 micrometers, between 0.3 micrometers and 0.5 micrometers, between 0.3 micrometers and 0.4 micrometers, between 0.4 micrometers and 0.6 micrometers, greater than 0.2 micrometers, greater than 0.3 micrometers, greater than 0.4 micrometers, less than 0.7 micrometers, less than 0.6 micrometers, less than 0.5 micrometers, or any suitable combination, sub-combination, range, or sub-range thereof.

The substrate 103 is any suitable material capable of being withstanding the conditions of the process 100. In various embodiments, the substrate 103 is a metallic material that is tempered or non-tempered, has grain structures that are equiaxed, directionally-solidified, and/or single crystal, has amorphous or crystalline structures, is a foil, fiber, a cladding, and/or a film. Suitable metallic materials include, but are not limited to, ferrous-based alloys, non-ferrous-based alloys, nickel-based alloys, stainless steels (martensitic or austenitic), aluminum alloys, composite metals, or combinations thereof. In an alternative embodiment, the metallic material is replaced with a non-metallic material. Suitable non-metal or non-metallic materials include, but are not limited to, ceramics, glass, ceramic matrix composites, or a combination thereof.

In one embodiment, the metallic material has a first iron concentration and a first chromium concentration, the first iron concentration being greater than the first chromium concentration. For example, suitable values for the first iron concentration include, but are not limited to, by weight, greater than 50%, greater than 60%, greater than 66%, greater than 70%, between 66% and 74%, between 70% and 74%, or any suitable combination, sub-combination, range, or sub-range therein. Suitable values for the first chromium concentration include, but are not limited to, by weight, greater than 10.5%, greater than 14%, greater than 16%, greater than 18%, greater than 20%, between 14% and 17%, between 16% and 18%, between 18% and 20%, between 20% and 24%, or any suitable combination, sub-combination, range, or sub-range therein.

In one embodiment, the metallic material is or includes a composition, by weight, of up to 0.08% carbon, between 18% and 20% chromium, up to 2% manganese, between 8% and 10.5% nickel, up to 0.045% phosphorus, up to 0.03% sulfur, up to 1% silicon, and a balance of iron (for example, between 66% and 74% iron).

In one embodiment, the metallic material is or includes a composition, by weight, of up to 0.08% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material is or includes a composition, by weight, of up to 0.03% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material is or includes a composition, by weight, of between 14% and 17% chromium, between 6% and 10% iron, between 0.5% and 1.5% manganese, between 0.1% and 1% copper, between 0.1% and 1% silicon, between 0.01% and 0.2% carbon, between 0.001% and 0.2% sulfur, and a balance nickel (for example, 72%).

In one embodiment, the metallic material is or includes a composition, by weight, of between 20% and 24% chromium, between 1% and 5% iron, between 8% and 10% molybdenum, between 10% and 15% cobalt, between 0.1% and 1% manganese, between 0.1% and 1% copper, between 0.8% and 1.5% aluminum, between 0.1% and 1% titanium, between 0.1% and 1% silicon, between 0.01% and 0.2% carbon, between 0.001% and 0.2% sulfur, between 0.001% and 0.2% phosphorus, between 0.001% and 0.2% boron, and a balance nickel (for example, between 44.2% and 56%).

In one embodiment, the metallic material is or includes a composition, by weight, of between 20% and 23% chromium, between 4% and 6% iron, between 8% and 10% molybdenum, between 3% and 4.5% niobium, between 0.5% and 1.5% cobalt, between 0.1% and 1% manganese, between 0.1% and 1% aluminum, between 0.1% and 1% titanium, between 0.1% and 1% silicon, between 0.01% and 0.5% carbon, between 0.001% and 0.02% sulfur, between 0.001% and 0.02% phosphorus, and a balance nickel (for example, 58%).

In one embodiment, the metallic material is or includes a composition, by weight, of between 25% and 35% chromium, between 8% and 10% iron, between 0.2% and 0.5% manganese, between 0.005% and 0.02% copper, between 0.01% and 0.03% aluminum, between 0.3% and 0.4% silicon, between 0.005% and 0.03% carbon, between 0.001% and 0.005% sulfur, and a balance nickel (for example, 59.5%).

In one embodiment, the metallic material is or includes a composition, by weight, of between 17% and 21% chromium, between 2.8% and 3.3% iron, between 4.75% and 5.5% niobium, between 0.5% and 1.5% cobalt, between 0.1% and 0.5% manganese, between 0.2% and 0.8% copper, between 0.65% and 1.15% aluminum, between 0.2% and 0.4% titanium, between 0.3% and 0.4% silicon, between 0.01% and 1% carbon, between 0.001 and 0.02% sulfur, between 0.001 and 0.02% phosphorus, between 0.001 and 0.02% boron, and a balance nickel (for example, between 50% and 55%).

In one embodiment, the metallic material is or includes a composition, by weight, of between 2% and 3% cobalt, between 15% and 17% chromium, between 5% and 17% molybdenum, between 3% and 5% tungsten, between 4% and 6% iron, between 0.5% and 1% silicon, between 0.5% and 1.5% manganese, between 0.005 and 0.02% carbon, between 0.3% and 0.4% vanadium, and a balance nickel.

In one embodiment, the metallic material is or includes a composition, by weight, of up to 0.15% carbon, between 3.5% and 5.5% tungsten, between 4.5% and 7% iron, between 15.5% and 17.5% chromium, between 16% and 18% molybdenum, between 0.2% and 0.4% vanadium, up to 1% manganese, up to 1% sulfur, up to 1% silicon, up to 0.04% phosphorus, up to 0.03% sulfur, and a balance nickel.

In one embodiment, the metallic material is or includes a composition, by weight, of up to 2.5% cobalt, up to 22% chromium, up to 13% molybdenum, up to 3% tungsten, up to 3% iron, up to 0.08% silicon, up to 0.5% manganese, up to 0.01% carbon, up to 0.35% vanadium, and a balance nickel (for example, 56%).

In one embodiment, the metallic material is or includes a composition, by weight, of between 1% and 2% cobalt, between 20% and 22% chromium, between 8% and 10% molybdenum, between 0.1% and 1% tungsten, between 17% and 20% iron, between 0.1% and 1% silicon, between 0.1% and 1% manganese, between 0.05 and 0.2% carbon, and a balance nickel.

In one embodiment, the metallic material is or includes a composition, by weight, of between 0.01% and 0.05% boron, between 0.01% and 0.1% chromium, between 0.003% and 0.35% copper, between 0.005% and 0.03% gallium, between 0.006% and 0.8% iron, between 0.006% and 0.3% magnesium, between 0.02% and 1% silicon+iron, between 0.006% and 0.35% silicon, between 0.002% and 0.2% titanium, between 0.01% and 0.03% vanadium+titanium, between 0.005% and 0.05% vanadium, between 0.006% and 0.1% zinc, and a balance aluminum (for example, greater than 99%).

In one embodiment, the metallic material is or includes a composition, by weight, of between 0.05% and 0.4% chromium, between 0.03% and 0.9% copper, between 0.05% and 1% iron, between 0.05% and 1.5% magnesium, between 0.5% and 1.8% manganese, between 0.5% and 0.1% nickel, between 0.03% and 0.35% titanium, up to 0.5% vanadium, between 0.04% and 1.3% zinc, and a balance aluminum (for example, between 94.3% and 99.8%).

In one embodiment, the metallic material is or includes a composition, by weight, of between 0.0003% and 0.07% beryllium, between 0.02% and 2% bismuth, between 0.01% and 0.25% chromium, between 0.03% and 5% copper, between 0.09% and 5.4% iron, between 0.01% and 2% magnesium, between 0.03% and 1.5% manganese, between 0.15% and 2.2% nickel, between 0.6% and 21.5% silicon, between 0.005% and 0.2% titanium, between 0.05% and 10.7% zinc, and a balance aluminum (for example, between 70.7% to 98.7%).

In one embodiment, the metallic material is or includes a composition, by weight, of between 0.15% and 1.5% bismuth, between 0.003% and 0.06% boron, between 0.03% and 0.4% chromium, between 0.01% and 1.2% copper, between 0.12% and 0.5% chromium+manganese, between 0.04% and 1% iron, between 0.003% and 2% lead, between 0.2% and 3% magnesium, between 0.02% and 1.4% manganese, between 0.05% and 0.2% nickel, between 0.5% and 0.5% oxygen, between 0.2% and 1.8% silicon, up to 0.05% strontium, between 0.05% and 2% tin, between 0.01% and 0.25% titanium, between 0.05% and 0.3% vanadium, between 0.03% and 2.4% zinc, between 0.05% and 0.2% zirconium, between 0.150 and 0.2% zirconium+titanium, and a balance of aluminum (for example, between 91.7% and 99.6%).

In one embodiment, the metallic material is or includes a composition, by weight, of between 0.4% and 0.8% silicon, up to 0.7% iron, between 0.15% and 0.4% copper, up to 0.15% manganese, between 0.8% and 1.2% magnesium, between 0.04% and 0.35% chromium, up to 0.25% zinc, up to 0.15% titanium, optional incidental impurities (for example, at less than 0.05% each, totaling less than 0.15%), and a balance of aluminum (for example, between 95% and 98.6%).

In one embodiment, the metallic material is or includes a composition, by weight, of between 11% and 13% silicon, up to 0.6% impurities/residuals, and a balance of aluminum.

EXAMPLES

In a series of examples, 3 mm electrodes are sputter-deposited onto the dielectric coating 105. For electrical contacts, 20-micron probes are used on a probe station: one stationary probe remains in contact with the stainless-steel substrate, while a second probe is placed on the top electrode. An Agilent LCR meter (HP4980A) is used to measure the capacitance and loss tangent. An HP4140B DC source and pA meter are used to apply the voltage and measure the current. Voltage, ranging between 0.1 and 0.5V, is applied for 2 seconds before measuring the current to make sure steady state is achieved. The curve is then linearly fitted to calculate the resistance. A Trek amplifier is used with a DC source to apply the voltage, which is increased at 100V/s until breakdown occurs. The voltage at which the final breakdown happens is recorded. Using the 2-parameter Weibull statistical analysis, the dielectric breakdown and Weibull modulus are extracted.

The relative permittivity and dielectric loss tangent are measured at room temperature under 1 kHz. Two breakdown field values are collected per example, with breakdown field value 1 being defect-driven breakdown and breakdown field value 2 being inherent dielectric material's breakdown.

In a first example, bulk resistivity data is obtained using gold electrodes. The dielectric coating 105 of the first example includes multiple layers having amorphous silicon and hydrogen consistent with the disclosure of U.S. Patent Application Publication 2018/0258529, filed on Feb. 27, 2018, entitled "Thermal Chemical Vapor Deposition Coating," the entirety of which is incorporated by reference. Measured values for the first example are shown in Table 1 below:

TABLE 1

| Bulk resistivity ($\Omega \cdot$ cm) | Relative permittivity (error) | Dielectric loss tan $\delta$ (error) | Breakdown field 1 (MV/cm) | Breakdown field 2 (MV/cm) | Weibull Modulus |
|---|---|---|---|---|---|
| $10^8$ | 18.9 (2.3) | 0.4 (0.04) | 0.09-0.1 | 0.15-0.2 | 4.3 |

In a second example, bulk resistivity data is obtained using silver electrodes due to poor adhesion of gold electrodes. The dielectric coating 105 of the second example includes silicon, oxygen, carbon, and hydrogen consistent with the disclosure of U.S. Pat. No. 10,604,660, filed May 23, 2013, entitled "Wear Resistant Coating, Article, and Method," the entirety of which is incorporated by reference. Measured values for the second example are shown in Table 2 below:

TABLE 2

| Bulk resistivity (Ω · cm) | Relative permittivity (error) | Dielectric loss tan δ (error) | Breakdown field 1 (MV/cm) | Breakdown field 2 (MV/cm) | Weibull Modulus |
|---|---|---|---|---|---|
| $10^{12}$ | 6.9 (1.2) | 0.6 (0.6) | N.A. | 5.9-9.6 | 4.6 |

In a third example, bulk resistivity data is obtained using silver electrodes due to poor adhesion of gold electrodes. The dielectric coating 105 of the third example includes silicon, nitrogen, and hydrogen consistent with the disclosure of U.S. Pat. No. 10,087,521, filed Dec. 1, 2015, entitled "Silicon-Nitride-Containing Thermal Chemical Vapor Deposition Coating," the entirety of which is incorporated by reference. Measured values for the third example are shown in Table 3 below:

TABLE 3

| Bulk resistivity (Ω · cm) | Relative permittivity (error) | Dielectric loss tan δ (error) | Breakdown field 1 (MV/cm) | Breakdown field 2 (MV/cm) | Weibull Modulus |
|---|---|---|---|---|---|
| $10^{13}$ | 8.3 (0.6) | 0.04 (0.05) | 4.2 | 6.6-7.7 | 14.6 |

All three examples exhibit defect-driven breakdown, but value 1 is not available for the second example due to poor data fitting. The dielectric strength values for the second example and the third example are only slightly lower than the literature values for silicon dioxide ($SiO_2$) and silicon nitride ($Si_3N_4$) (both at 10 MV/cm).

Dielectric breakdown in all three examples occur over some time by what appears like defects self-clearing until the final failure takes place. As used herein, the term "self-clearing" refers to the localized breakdown of dielectric films due to the presence of impurities such as pinholes or embedded foreign particles. After a self-clearing event, the dielectric material may continue to sustain the application of an electric field, for example, in behavior often observed in polymers as "graceful failures" in contrast to sudden catastrophic failures. The graceful failure allows ability to maintain functionality when portions of the dielectric coating 105 breakdown.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A dielectric article, comprising:
   a substrate having hidden surfaces; and
   a dielectric coating on the hidden surfaces of the substrate, the dielectric coating having a bulk resistivity of at least $10^8$ Ohms·cm and a thickness between 30 nanometers and 3,000 nanometers;
   wherein the dielectric coating comprises silicon, oxygen, carbon, and hydrogen.

2. The dielectric article of claim 1, wherein the substrate further comprises visible surfaces and the dielectric coating is on the visible surfaces.

3. The dielectric article of claim 1, wherein the bulk resistivity at least $10^{12}$ Ohms·cm.

4. The dielectric article of claim 1, wherein the bulk resistivity at least $10^{13}$ Ohms·cm.

5. The dielectric article of claim 1, wherein the thickness is between 50 nanometers and 2,000 nanometers.

6. The dielectric article of claim 1, wherein the thickness is between 100 nanometers and 1,500 nanometers.

7. The dielectric article of claim 1, wherein the thickness is between 300 nanometers and 1,500 nanometers.

8. The dielectric article of claim 1, wherein the thickness is between 400 nanometers and 1,500 nanometers.

9. The dielectric article of claim 1, wherein the thickness is between 500 and 1,500 nanometers.

10. The dielectric article of claim 1, wherein the dielectric coating comprises multiple layers having amorphous silicon and hydrogen.

11. The dielectric article of claim 1, wherein the dielectric coating comprises silicon, nitrogen, and hydrogen.

12. The dielectric article of claim 1, wherein the dielectric article is a portion of an antenna.

13. The dielectric article of claim 1, wherein the dielectric article is an antenna.

14. A radio frequency (rf) system containing the dielectric article of claim 1.

15. A transmission line containing the dielectric article of claim 1.

16. The dielectric article of claim 1, wherein the substrate is a stainless steel.

17. The dielectric article of claim 1, wherein the substrate is an aluminum alloy.

18. A dielectric article, comprising:
    a stainless steel substrate having hidden surfaces and visible surfaces; and
    a silicon-containing dielectric coating on the hidden surfaces and the visible surfaces of the stainless steel substrate, the silicon-containing dielectric coating having a bulk resistivity of at least $10^{12}$ Ohms·cm and a thickness of between 100 nanometers and 1,500 nanometers;
    wherein the dielectric coating comprises silicon, oxygen, carbon, and hydrogen.

19. A dielectric article, comprising:
    a metallic substrate having hidden surfaces and visible surfaces; and
    a silicon-containing dielectric coating on the hidden surfaces and the visible surfaces of the metallic substrate, the silicon-containing dielectric coating having a bulk resistivity of at least $10^{12}$ Ohms·cm and a thickness of between 100 nanometers and 1,500 nanometers;
    wherein the dielectric coating comprises multiple layers having amorphous silicon and hydrogen;
    wherein the dielectric coating comprises silicon, oxygen, carbon, and hydrogen.

* * * * *